United States Patent

Loxley et al.

[15] 3,640,398

[45] Feb. 8, 1972

[54] WAFER BOAT

[72] Inventors: Ted A. Loxley, Mentor; John M. Webb, Chagrin Falls; Walter G. Barber, North Perry, all of Ohio

[73] Assignee: Edward J. Mellen, Jr., Cleveland, Ohio

[22] Filed: Mar. 30, 1970

[21] Appl. No.: 23,680

[52] U.S. Cl. ....................211/41, 65/54, 118/500, 269/289

[51] Int. Cl. ....................H01l 7/00, B05c 11/14

[58] Field of Search ....................29/569; 65/54, 55; 118/500, 118/503; 148/175, 189; 211/41; 269/37, 43, 289

[56] References Cited

UNITED STATES PATENTS

| | | | |
|---|---|---|---|
| 3,553,037 | 1/1971 | Bell | 148/189 |
| 2,348,414 | 5/1944 | Pierce | 211/41 |
| 3,473,980 | 10/1969 | Beadle et al. | 148/189 |
| 3,480,151 | 11/1969 | Schmitt | 211/41 |

*Primary Examiner*—Theron E. Condon
*Assistant Examiner*—Neil Abrams
*Attorney*—McCoy, Greene & Howell

[57] ABSTRACT

A quartz-glass carrier frame for supporting a series of rows of silicon wafers made by clamping a single row of flat quartz-glass rods together with rows of shims having a thickness substantially equal to the wafer thickness, welding the rods together at spaced locations along their length, and welding lateral quartz-glass spacer rods to the longitudinal rods and to a flat bottom plate.

19 Claims, 11 Drawing Figures

INVENTORS
TED A. LOXLEY
JOHN M. WEBB
WALTER G. BARBER
BY
McCoy, Greene & Howell
ATTORNEYS INVENTORS
TED A. LOXLEY
JOHN M. WEBB
WALTER G. BARBER
BY
McCoy, Greene & Howell
ATTORNEYS INVENTORS
TED A. LOXLEY
JOHN M. WEBB
WALTER G. BARBER
BY
McCoy, Greene & Howell
ATTORNEYS

WAFER BOAT

DESCRIPTION OF THE INVENTION

The present invention relates to silica-glass wafer carriers and more particularly to a wafer carrier formed from flattened quartz-glass rods and to a process of making such wafer carrier.

In the manufacture of microelectronic circuits, use is commonly made of microscopic transistors and diodes in the form of generally square chips. In the manufacture of such "chips," thin wafers are cut from rods of grown silicon crystal. Large numbers of these wafers are then treated to control their electrical conducting nature. The wafers may be subjected to washing, heating or gas diffusion treatments and thereafter diced by means of a high-speed abrasive saw into thousands of chips. The dopants used in the diffusion process may be vapors containing boron, phosphorus, or other metals.

In order to facilitate handling of these silicon-crystal wafers during processing, it is conventional to provide so-called "wafer boats" which are quartz-glass carriers or carrier frames having a large number of wafer-receiving slots cut therein. Such slots are located to support the wafers in vertical positions in closely spaced rows so that one wafer boat may have the capacity to hold several hundred wafers. Because the slots receive only a small portion of the wafer, they must be formed to close tolerances to function properly.

Prior to this invention such wafer boats have been very expensive because of the cost of cutting accurately a large number of wafer-receiving slots and because of the breakage which normally occurred. It was commonly expected that there would be a few breaks in every boat because of the close spacing of the slots. Also it was expected that the breakage would continue during repeated use of the boats and that boats would have to be replaced frequently.

The present invention provides a unique type of wafer carrier which may be formed without any slot-cutting operations at low cost and yet is far superior to any wafer boat previously known. The process of this invention makes it possible to provide the close tolerances required in the wafer-receiving slots even though the long rods used in forming the slots are normally bowed or deformed prior to the assembly and welding operations.

In carrying out the process of this invention, 10 to 25 or more flattened silica-glass rods are clamped together in a single row in a special clamping fixture having a series of independent spring-pressed clamping members, and a series of rows of shims with a thickness corresponding to that of the silicon wafers are placed between the rods to space them apart. While clamped in position, the longitudinal rods are welded together along lateral weld lines. Thereafter, lateral glass spacer rods are welded to the longitudinal rods above such lateral weld lines and the rods are welded to a suitable glass baseplate. The top and bottom portions may be connected together at minimum cost by use of welds extending vertically from the end of each lateral rod to the baseplate.

An object of the invention is to provide a simple inexpensive process for manufacture of high quality silica-glass diffusion boats.

A further object of the invention is to provide a wafer boat having an increased useful life and less tendency to break during manufacture or use.

Another object of the invention is to provide a glass wafer boat having slots with smooth surfaces which are not readily contaminated.

Another object of the invention is to provide a process for accurately forming a multiplicity of wafer-receiving slots of the desired size from glass rods which are bowed or deformed slightly.

These and other objects, uses and advantages of the invention will become apparent from the following description and claims and from the drawings, in which:

Figure 1:
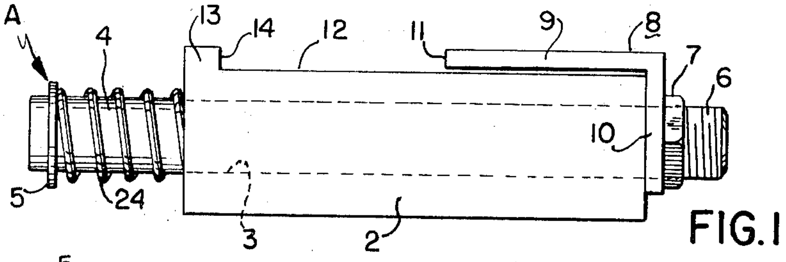
FIG. 1 is an end elevational view of a clamping assembly used to assemble the wafer boat of this invention.
Figure 2:
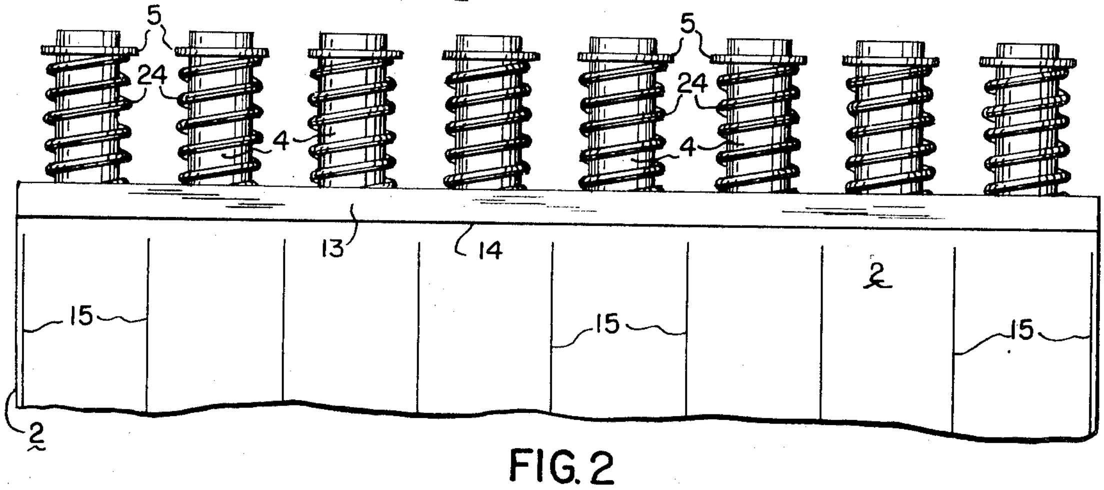
FIG. 2 is a fragmentary top view of the clamping assembly of FIG. 1 on a larger scale.
Figure 3:
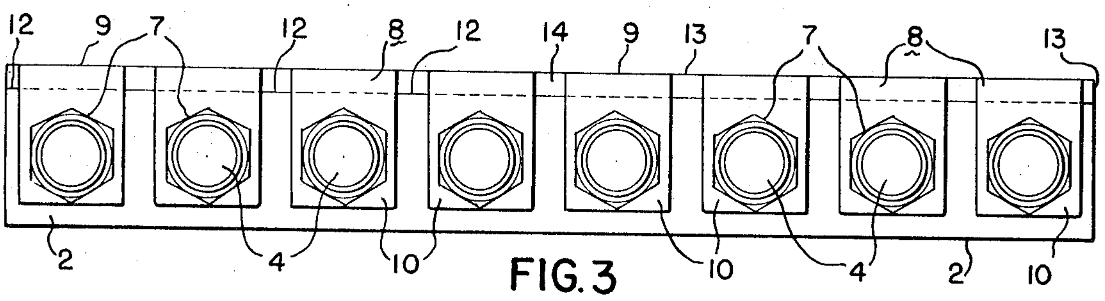
FIG. 3 is a side elevational view of the assembly on the same scale as FIG. 2.

Referring more particularly to the drawings, in which like parts are identified by the same numerals throughout the several views, FIGS. 1, 2 and 3 show a clamping assembly A for use in assembling the longitudinal glass rods of the wafer boat of this invention. The assembly comprises a generally rectangular block 2 having a series of cylindrical bores 3 regularly spaced along its length to receive a row of cylindrical steel guide rods 4 having their axes in a common horizontal plane, a series of L-shaped clamping members 8 rigidly mounted on the rods 4 at one side of the block 2, and a series of helical springs 24 mounted on the rods at the opposite side of the block. Each rod 4 has a spring-retaining ring 5 mounted at one end and a threaded end portion 6 of reduced diameter at the opposite end which receives a hexagonal nut 7.

Each of the clamping members 8 has a flat horizontal portion 9 overlying the flat horizontal upper surface 12 of the block 2 and a flat vertical flange 10 with a circular opening to receive the end portion 6. Such opening may have a diameter slightly less than that of the cylindrical external surface of the rod 4 so that the flange 10 is rigidly clamped in position on the rod when the nut 7 is tightened, but this is not essential.

The springs 24 are compressed between the rings 5 and the vertical side face of the block 2 to bias the members 8 toward the upright longitudinal guide flange 13, which extends the full length of the block. The flange has a flat narrow vertical face 14 located in a plane perpendicular to the axes of the guide rods 4 and parallel to the flat vertical face 11 of each member 8. The faces 11 and 14 engage the longitudinal glass rods 25 to clamp them in place, and they preferably extend vertically the full height of the glass rods (see FIG. 4).

The block 2 may be formed of steel or other metal or may be formed of carbon or graphite or a refractory material. The flat upper surface of the block is preferably provided with a series of regularly spaced lateral guide lines 15 perpendicular to the surface 14 of the guide flange and extending substantially from said flange to the opposite side of the block 2 adjacent one of the flanges 10.

Figure 4:
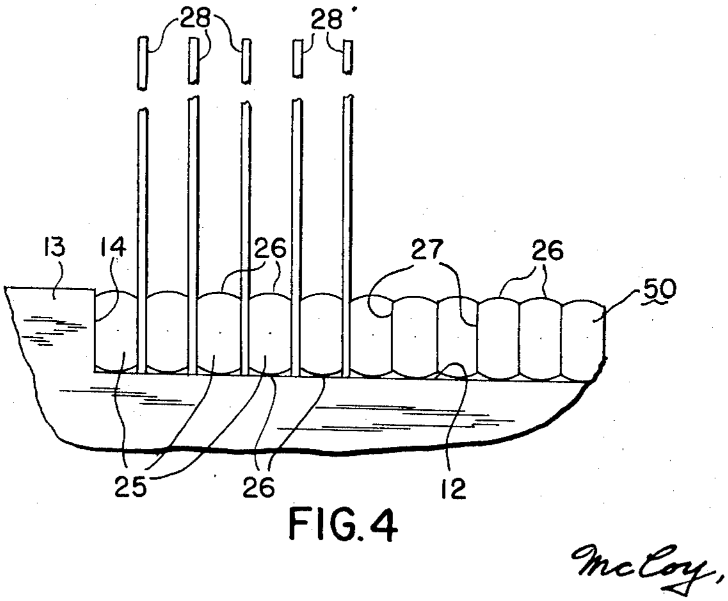
FIG. 4 is a fragmentary end elevational view on a larger scale showing the glass rods clamped in position with some of the shims in place.

In performing the process of this invention, 10 to 25 or more quartz-glass rods 25 of the same length and cross section are placed in side-by-side parallel relation on the upper surface 12 of the block 2 as shown in the right half of FIG. 4 to form a row 50 having a combined width greater than the normal distance between the faces 11 and 14. This compresses the springs and moves the flanges 10 out of contact with the block 2.

Figure 5:
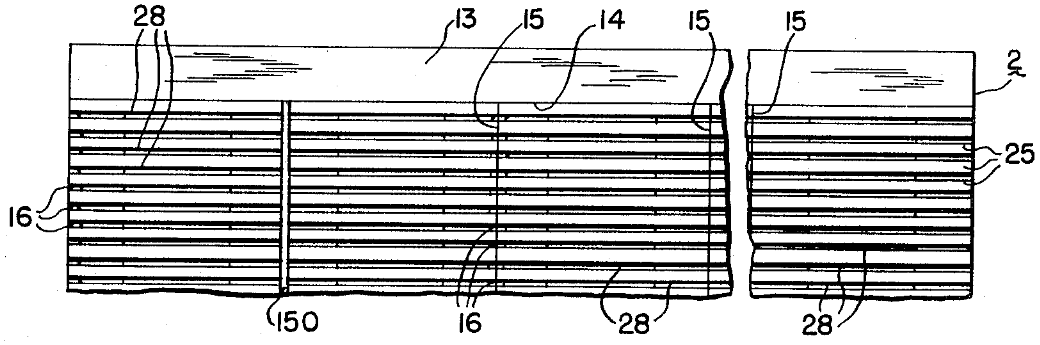
FIG. 5 is an enlarged foreshortened fragmentary top plan view with parts omitted showing the clamped position of the glass rods during the first welding operation after the shims are in place.

The rods 25 preferably have a length equal to that of the block 2 and are preferably placed on the block with their ends in lateral alignment with the vertical end face of the block as shown in FIG. 5. Each rod 25 has a uniform width and a uniform vertically elongated cross section throughout its length and has narrow flat parallel vertical side faces 27 with a uniform width preferably greater than the thickness of the rod between its opposite faces 27. The upper and lower surfaces 26 of each rod 25 may be flat or may be cylindrical and arcuate in cross section as shown in the drawings. Such surfaces may, for example, have a radius of curvature equal to half the vertical height of the rod as shown in FIG. 4, which is drawn substantially to scale.

The glass rods 25 are preferably formed by drawing glass rods of similar but much larger cross section formed by cutting or grinding a starting piece of silica glass. Such glass is preferably formed of high-purity quartz glass or fused silica and contains at least 90 percent and preferably at least about 99 percent silica, and best results are obtained using a clear or transparent glass rather than a translucent or glazed glass. However, satisfactory results can be obtained starting with a high purity silica glass which is pressed, slip cast or otherwise formed from finely divided quartz glass or fused silica and thereafter sintered.

The starting piece may be a solid glass rod of circular, elliptical or other oval cross section or a flat glass plate, ribbon or ingot. If it is a drawn glass rod, the opposite side faces (corresponding to side faces 27) are flattened by cutting or grinding the rod to obtain the desired generally rectangular cross section which is that same shape as that of the rod 25 but much larger in size. Such rod is then redrawn to reduce the cross-sectional area at least 50 percent while maintaining the generally rectangular shape shown in FIG. 4. The redrawing operation provides a smooth surface at 27 with less tendency to crack and, therefore, provides a superior product. The faces 27 should be formed flat and straight, but it will be understood that some of the rods 25 may bow slightly after being formed. These can be straightened during the assembly process of this invention or caused to function properly as described below.

The glass rod used as a starting piece should have a diameter of about 0.3 inch to about 1.5 inches and preferably has a diameter of about 0.4 inch to about 1.0 inch (before the sides of the rod are flattened).

If the starting piece is a glass plate, ribbon or ingot, then a plurality of glass rods or strips uniform rectangular cross section are cut from such plate, ribbon or ingot and drawn to a smaller cross section while maintaining substantially the same relative shape (e.g., the same ratio of width to thickness). The thickness of such plate or ribbon could be anywhere from 0.1 inch to 2 inches and is preferably about 0.2 inch to about 1 inch. The glass rods cut from the plate or ribbon have a width about 1 to 5 times the thickness of the rod and preferably about 1.5 to about 4 times such thickness. Such glass rods usually have a width of 0.3 to 1.0 inch and a thickness of 0.1 to 0.5 inch.

After the rods are cut or formed with the desired flattened cross section by cutting or grinding a rod, plate or other piece as described above, the cross-sectional area is reduced at least 50 percent by drawing or redrawing the rod while maintaining substantially the same relative cross-sectional shape or the same ratio of width to thickness. For example, a glass rod with an initial width of 0.4 inch and an initial thickness of 0.1 inch (cut from a plate of the same thickness), could be heated and drawn to provide a rod (25) with a uniform width of 0.1 inch and a uniform thickness of 0.025 inch. A glass rod with a width of 0.5 inch and a thickness of 0.25 inch formed by grinding the opposite sides of a drawn glass rod could be drawn to provide a rod 25 as shown in FIG. 4 with a width of 0.1 inch and a thickness of 0.05 inch. The amount of drawing is such as to reduce the width or thickness of the rod at least 25 percent and preferably 40 to 80 percent and to provide rods 25 having a width of about 0.05 to about 0.25 inch and a thickness of about 0.015 to about 0.1 inch.

The drawing operation increases the length of the glass so that it is necessary to cut the rods 25 to the desired length. Such length is preferably 4 inches to 24 inches but may be much less, particularly if the rods are placed end to end in the wafer boat.

Figures 6, 7:
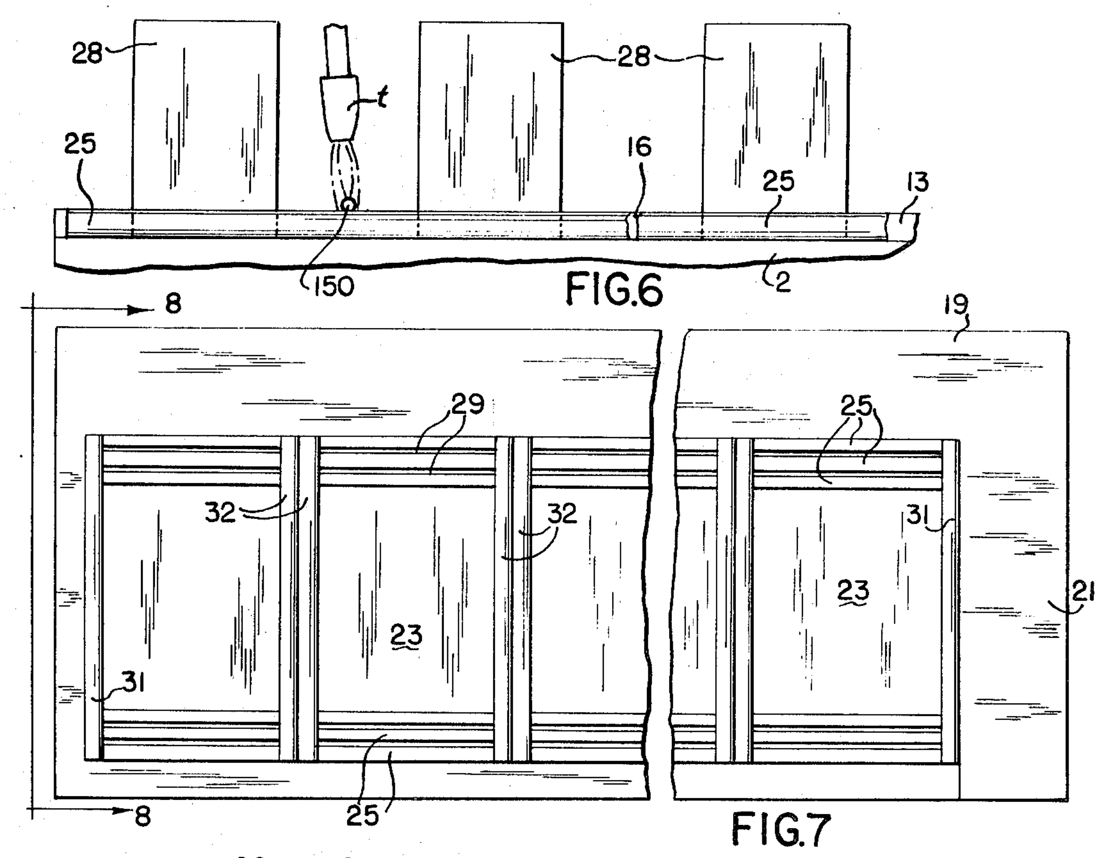
FIG. 6 is a fragmentary elevational view on a larger scale showing how welding of the clamped glass rods is accomplished.
FIG. 7 is an enlarged foreshortened top view showing the wafer boat and the apparatus used to position the lateral glass rods during the second welding operation.

The initial assembly operations are illustrated in FIGS. 4, 5 and 6. After the rods 25 are mounted on the surface 12 of the block 2, a multiplicity of thin flat vertically elongated rectangular strips or shims 28 with a uniform thickness approximately equal to that of the silicon wafers *w* are forced downwardly between each rod 5 and the next adjacent rod until they touch the surface 12 as shown in FIGS. 4 and 6. Each shim 28 is placed approximately midway between the guide lines 15 of the surface 12 as shown in FIG. 5 and preferably has a width which is about 0.4 to 0.6 times the distance between the lines 15. The shim may be made of a metal, such as steel or other hard stiff flexible material, having adequate strength, rigidity and resistance to melting. The shim should be accurately formed with a thickness which varies no more than ±0.001 inch and preferably no more than ±0.0005 inch.

When inserting the shims 28, best results are obtained by inserting one complete row of longitudinally spaced shims between two adjacent rods 25 before starting the next longitudinal row of shims at the next adjacent rod. Thus each row of shims is formed starting at one end of a rod and progressively moving toward the opposite end of the rod. Then another row is formed in the same manner as the next adjacent rod. The first row of shims is preferably formed against the rod 25 at one side of the block 2 to engage the surface 11 or 14, and each successive row is formed in the same manner to further compress the springs 24 until all of the shims have been placed. The combined thickness of the shims and the rods 25 in the assembled row 50 must, of course, be less than the width of the surface 12 and no greater than the maximum width permitted by the springs 24.

After all of the shims are in place as shown in FIG. 5, the rods 25 are welded together substantially at the lateral guide lines 15, which are spaced apart a distance at least equal to and preferably slightly greater than the diameter of the silicon wafers *w*. This forms a lateral weld 16 above each line 15 which extends between each rod 25 and the next adjacent rod 25. In connection with the clamping assembly A, there would thus be formed nine longitudinally spaced weld areas 16 along the length of the rods 25.

The welds 16 are preferably formed by laying a piece of fused silica or quartz glass welding rod 150 in a position above each guide line and melting it with a fine-tip hydrogen-oxygen torch *t* as shown in FIG. 6 so that the silica glass flows into and bridges the space between the adjacent rods 25. The shims 28 are spaced far enough apart to accommodate such torching.

The rod 150 may have a length equal to the width of the wafer boat B, in which case its diameter should be at least 1½ and preferably about 2 to 4 times the thickness of the shim 28. Such diameter should be sufficient to bridge the space between adjacent rods 25 when the rod 150 is melted and caused to run into such space. The maximum diameter of the rod 150 is preferably less than half the height of each rod 25 so that it can be melted without melting a substantial portion of the rod 25. The rod 150 could have a somewhat greater diameter if it is hollow, but such rod is preferably solid. The rods 25 may also be hollow, but they should be solid to provide maximum strength and resistance to melting.

In performing the process of this invention the transverse rods 150 are preferably melted (see FIG. 6) so that they flow into the narrow spaces between the rods 25 and so that the resulting welds 16 are flush with or slightly lower than the upper surfaces 26 of the rods 25 and do not project above said upper surfaces enough to interfere with subsequent spacing of the rods 31 and 32. The diameter of each rod 150 is less than that of the rods 25 so that the torch heat necessary to effect such melting of the rods does not damage the rods 25.

Welding with the rods 150 is preferably effected starting at one end of the block 2. After one lateral rod 150 is melted to form the lateral welds 16 and join the ends of all of the longitudinal rods 25, another rod 150 is placed above the next adjacent guide line 15 and melted to form another row of lateral welds 16. This is repeated until nine rods 150 are melted above the nine guide lines 15. This leaves, between the lateral welds 16, the narrow wafer-receiving slots 29 formed between the rods 25.

During the above-described welding operations, the shims and longitudinal rods are firmly held in position by the springs 24. When the shims are properly placed and the clamping assembly is functioning properly, all or substantially all of the shims will be held in true vertical positions. This can readily be determined by visual inspection.

The forming process of this invention has the advantage that it compensates for warping or bowing of some of the rods 25 and relieves the stresses tending to move the faces 27 of adjacent rods out of parallelism. This is important because most of the rods will be bowed somewhat. Because each spring 24 acts on one portion only of the row 50 of longitudinal rods and acts independently of the other springs, a misalignment at one end of the row 50 need not cause misalignment at other portions of the wafer boat. For example, of one of the longitudinal rods 25 is warped or bowed, the torching of one rod 150 tends to soften and relieve the stresses in that rod 25 so that the spring 24 acting in this area can bring the surfaces 27 substantially into parallel relation. This reduces the adverse effect of the deformed rod 25 on the remaining portions of the row 50. The torching and melting of the next rod 150 has a similar effect and further compensates for the initial misalignments. It thus becomes possible to provide a wafer boat which functions exceptionally well even if the individual rods 25 of the boat are not straight. The wafer-receiving slots 29 can, therefore, be formed to close tolerances in spite of slight bowing, warping or misalignment of some or many of the rods 25.

After the rods 25 are welded together on the clamping assembly A to complete the assembled row 50, such row is removed from the assembly, the shims 28 are removed, and the assembled row is placed on top of a transparent to translucent silica glass plate 30 of rectangular shape having a uniform thickness. Such plate is preferably formed of quartz glass or sintered or glazed fused silica and contains at least 90 percent and preferably at least 99 percent silica. The plate 30 has a width and length equal to that of the assembled row 50 and has a flat upper surface which engages the bottom surface of each of the rods 25.

Suitable means may be provided for holding the parts in position while they are welded to the plate 30. As herein shown, the wafer boat B is assembled on a refractory positioning block C formed of carbon, graphite or other suitable refractory material. The block C has a main rectangular portion 17 of uniform thickness with a flat horizontal upper surface 18, a rectangular flange portion 19 of uniform thickness with a flat vertical face 20 perpendicular to the surface 18 and extending the full length of the portion 17, and a rectangular end flange 21 with a flat vertical face 22 perpendicular to the surface 18 and 20. The surface 18 is rectangular and has a length and width greater than the length and width of the glass plate 30.

Figure 9:
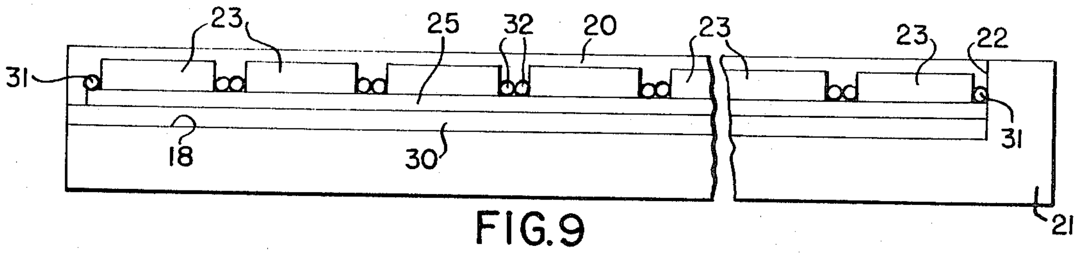
FIG. 9 is a foreshortened front elevational view of the boat and apparatus of FIGS. 7 and 8 on a smaller scale.

The plate 30 is placed on the horizontal surface 18 with its edges in contact with the vertical faces 20 and 22, and the assembled row 50 of welded rods 25 is placed directly over the plate 30 with the ends of the rods in contact with the face 22 as shown in FIG. 7. Then a series of quartz glass rods 31 and 32 of the same diameter having a length equal to the width of the plate 30 are placed on the top of the row 50 in regularly spaced relation as shown in FIG. 9, said rods being positioned in parallel lateral positions perpendicular to the rods 25 by means of a series of flat rectangular blocks 23 of uniform thickness having a width equal to the desired spacing between the rods 32. The diameter of the rods 32 are preferably such that they will properly locate the wafers 2 (see FIG. 11) when pairs of them rest on the top of the rods 25 and are in engagement with each other along lines of contact extending laterally directly above the lateral welds 16.

The width of the blocks 23 is such that these lateral lines of contact are spaced apart a distance slightly greater than the diameter of the wafers *w*. The length of the blocks 23 is no greater than the width of the plate 30 and is preferably about one-half to two-thirds of such width. The blocks 23 are preferably formed of carbon, graphite or other refractory material.

Figure 8:
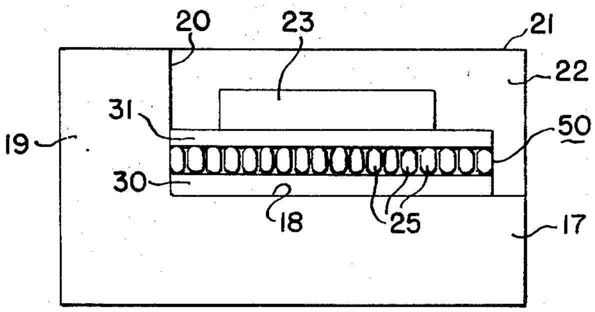
FIG. 8 is an end view of the wafer boat and positioning apparatus of FIG. 7 on the same scale.

After the rods 31 and 32 are placed as shown in FIG. 7, 8 and 9, the end portions of such rods are welded to provide a rigid connection to the wafer boat, and the rods 25 are welded to the plate 30. Such welding is preferably performed first on the side of the boat B remote from the longitudinal flange portion 19 and then on the opposite side of the boat after it has been removed from the block C or after its position on the block has been reversed.

Figure 10:
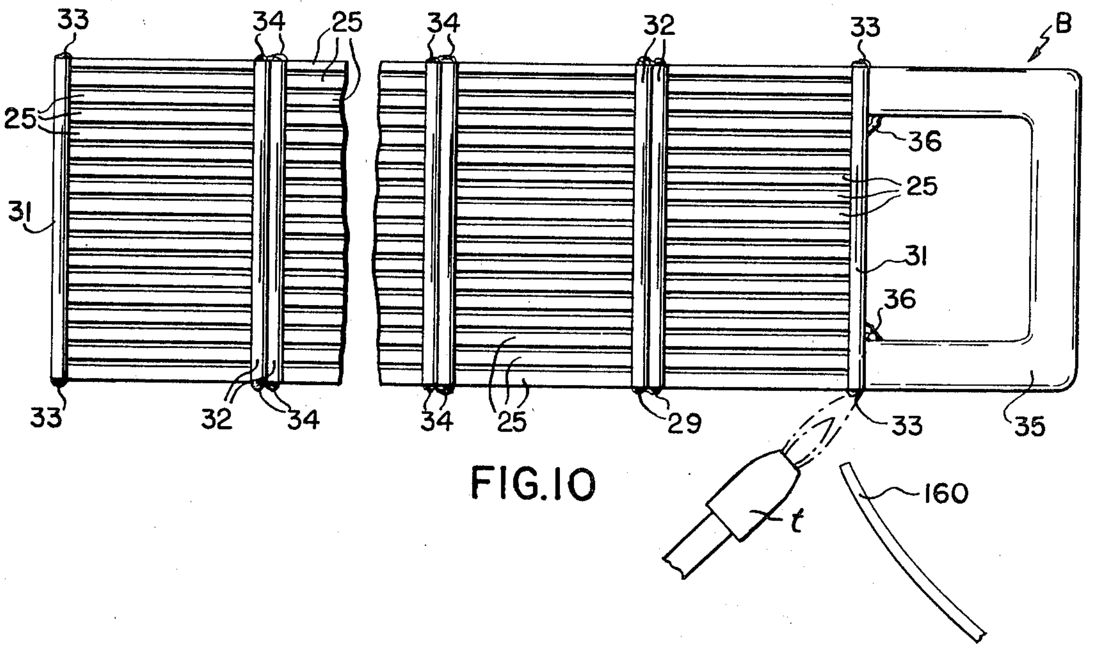
FIG. 10 is an enlarged foreshortened top view of a complete wafer carrier constructed according to the present invention showing how welding may be performed.

The preferred method of welding involves placing the end portion of a quartz-glass welding rod 160 at the end of each lateral rod 32 and melting the excess glass from the welding rod with a suitable hydrogen-oxygen torch *t* so that it runs from the end of the lateral rod over the outer side of the underlying longitudinal rod 25 and the outer side of the plate 30 to form an end weld 34 rigidly connecting the rod 32 to said rod 25 and to said plate. An end weld 33 is formed in the same way at the end of each lateral rod 31 to connect such rod to the corner of the plate 30. In the wafer boat A shown herein, there are seven end welds 34 and two corner welds 33 at each side of the boat. After these welds have been formed on one side, the rods 31 and 32 are firmly attached to the plate 30 and are held in position so that the remaining welds 33 and 34 can easily be formed at the proper locations on the opposite side of the boat even when the blocks 23 are removed. The boat is then completed by welding a conventional U-shaped handle 35 to one end as shown in FIG. 10. An interior weld 36 is preferably provided on each leg of the handle to connect it to the plate 30 and the end portions of the rods 25.

Figure 11:
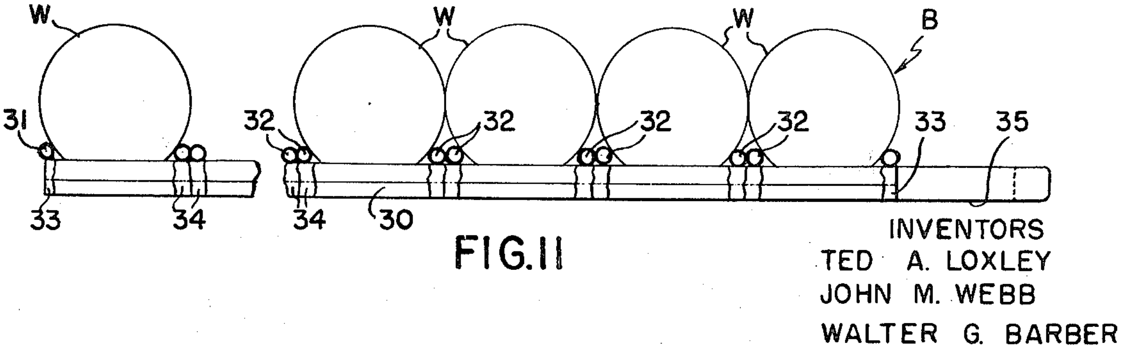
FIG. 11 is a foreshortened side elevational view of the carrier of FIG. 10 on the same scale as FIGS. 1, 2, 3 and 9 showing the rows of silicon wafers mounted in the slots of the carrier.

The completed quartz diffusion boat or wafer carrier B of this invention is illustrated in FIGS. 10 and 11. Such boat may be formed in various sizes and may handle silicon crystal wafers with a thickness up to 0.04 inch and a diameter up to 3 inches. However, the boat preferably has a length of about 6 to 24 inches and a width of about 1 inch to about 2 inches and preferably has a wafer-receiving slots 29 of a size to receive wafers *w* having a diameter of about one-half inch to about 2 inches and a thickness of about 0.006 to about 0.030 inch. The depth of the slots 29 and the location of the lateral rods 32 are such that the wafers will project into the slots a vertical distance which is about 0.06 to 0.2 times the wafer diameter and is preferably about one-tenth to about one-sixth of said wafer diameter. Such vertical distance and the vertical height of each rod 25 is usually between 0.07 inch and 0.15 inch. The transverse rods 31 and 32 usually have a diameter between about 0.050 inch and about 0.150 inch. If desired the pairs of rods 32 may be replaced by narrow quartz glass strips of generally rectangular cross section. Such strips would preferably have uniform width of about 0.08 inch to about 0.25 inch and a uniform thickness of about 0.040 inch to about 0.10 inch.

A typical quartz diffusion boat B made according to this invention may for example, have a length of about 1 foot, a width of 1.5 to 2 inches and slots 29 arranged to receive silicon-crystal wafers *w* having a diameter of about 1 inch and a thickness of about 0.013 inch. In such a boat B the longitudinal rods may, for example have a height of 0.10 inch and a thickness of 0.064 inch, the lateral rods 31 and 32 may have a diameter of about 0.09 inch, and the plate 30 may have a thickness of about 0.10 to 0.13 inch. In forming such a boat, the welding rods 150 would preferably have a diameter of about 0.030 to 0.035 inch and the welding rods 160 used to weld the rods 31 and 32 would preferably have a diameter of about 0.040 to 0.050 inch.

The longitudinal rods in the above example may, for example, be formed by drawing or redrawing one or more transparent quartz-glass rods of generally rectangular cross section having a width of one-half inch and a thickness of one-quarter inch. The latter rods may be formed either by cutting a quartz-glass plate or ribbon with a thickness of one-quarter inch or by cutting or grinding the opposite side portions of a quartz glass rod having a diameter one-half inch.

The wafer boat of the invention may be employed to support wafers made from crystals of silicon or germanium or the like, and the size and shape of the boat will to some extent depend on the size of the wafers.

It will be understood that the above description and the dimensions given are by way of example only and that variations and modifications of the specific devices disclosed herein may be made without departing from the spirit of the invention.

Having described our invention, we claim:

1. A carrier frame for supporting a series of rows of silicon crystal wafers comprising a rectangular glass plate (30), a large number of regularly spaced longitudinal glass rods (25) mounted in uniformly spaced parallel relation on said plate to provide a multiplicity of narrow wafer-receiving slots (29), each having a height at least several times its width and a series of lateral spacer rods (31, 32) welded to said longitudinal rods and spaced apart a distance which is at least 20 times the width of said slots, said longitudinal rods having flattened vertical side faces (27) forming the sides of said slots.

2. A carrier frame as defined in claim 1 wherein said longitudinal rods (25) are welded to each other along longitudinal weld lines (16) which are spaced apart a distance which is at least 20 times the width of said slots.

3. A carrier frame as defined in claim 1 wherein said longitudinal rods (25) have a height of about 0.05 to about 0.2 inch and a length of about one-third foot to about 3 feet and are spaced apart to provide wafer-receiving slots (29) with a width of about 0.005 to about 0.03 inch.

4. A carrier frame as defined in claim 3 wherein said lateral rods (32) are spaced apart a distance of about 0.5 inch to about 1.5 inch.

5. A carrier frame as defined in claim 1 wherein the end portions of said lateral spacer rods (31, 32) are rigidly connected by welds (33, 34) to the glass plate (30).

6. A carrier frame as defined in claim 1 wherein said glass rods (25) have a cross-sectional width of about 0.03 inch to about 0.1 inch.

7. A carrier frame as defined in claim 1 wherein said glass rods (25) are formed of quartz glass and have a cross-sectional height of about 0.04 inch to about 0.2 inch.

8. A process of forming a carrier frame for a series of rows of silicon crystal wafers comprising clamping at least 10 straight glass rods of vertically elongated cross section having flattened side faces in a row with said side faces in engagement with vertical shim strips having a uniform thickness corresponding to the thickness of the silicon crystal wafers, welding said rods in fixed parallel positions while they are so clamped, and thereafter removing said shim strips.

9. A process as defined in claim 8 wherein said glass rods are welded together substantially along transverse weld lines to provide welds bridging the spaces between the rods.

10. A process as defined in claim 8 wherein said glass rods are welded in place on a silica glass frame member to provide welds extending between said rods and said frame member.

11. A process as defined in claim 10 wherein transverse silica glass rods are placed on the upper surfaces of said first-named glass rods, and the end portions of said transverse rods are welded to said frame member to provide said last-named welds.

12. A process as defined in claim 8 wherein said shim strips are placed in rows corresponding in number to the number of rows of wafers to be supported and clamping pressure is applied to the glass rods independently at each of said rows while the rods are welded in place.

13. A process as defined in claim 8 wherein said glass rods (25) are formed by grinding the opposite side faces of drawn quartz glass rods having a diameter of about 0.3 inch to about 1 inch and thereafter heating and redrawing said rods to a width of about 0.05 to about 0.2 inch.

14. A process as defined in claim 8 & 5 wherein said glass rods (25) are formed by cutting strips of rectangular cross section from a piece of quartz glass, said strips having a width of about 0.3 to about 1 inch and a thickness of about 0.1 to about 0.5 inch, and thereafter heating and drawing said strips.

15. A carrier frame as defined in claim 1 wherein said lateral spacer rods are mounted on at least 10 of said glass rods having a length of at least 4 inches and are arranged to engage and support 5 to 20 lateral rows of said wafers.

16. A rigid carrier frame (B) for supporting at least five closely spaced lateral rows of silicon crystal wafers (*w*) comprising at least 10 closely spaced longitudinal glass rods (25) mounted in closely spaced parallel relation in a row to provide a multiplicity of narrow slots (29) for receiving the wafers (*w*) and holding them in upright positions, each slot having a height at least several times its width, and a series of wafer-engaging lateral spacer rods (31,32) rigidly mounted above said longitudinal rods and spaced apart a distance which is at least 20 times the width of said slots, each of said longitudinal rods (25) having a length of at least 4 inches and having an opposed pair of smooth flattened wafer-engaging side faces (27) forming the sides of the wafer-receiving slots (20) at the opposite sides of such rod.

17. A silica-glass carrier frame for supporting at least five closely spaced lateral rows of silicon crystal wafers comprising at least 10 closely spaced longitudinal glass rods mounted in closely spaced parallel relation in a row to provide a multiplicity of narrow slots for receiving the wafers and holding them in upright parallel positions, each slot having a height at least several times its width, and a series of lateral silica-glass spacer means welded to said longitudinal rods and providing a rigid connection from each longitudinal rod to the next adjacent rod, said lateral spacer means being spaced apart a distance which is at least 20 times the width of said slots, each of said longitudinal rods having a length of at least 4 inches and having an opposed pair of flattened wafer-engaging side faces forming the sides of the wafer-receiving slots at the opposite sides of such rod, and means carried above said spacer means for engaging the wafers in each of said lateral rows to hold them in lateral alignment in each row.

18. A silica-glass wafer carrier frame as defined in claim 17 wherein said last-named means comprises lateral silica glass rods welded to said frame.

19. A process of forming a silica-glass carrier frame (B) for at least eight closely spaced lateral rows of silicon crystal wafers (*w*) comprising holding 10 to 25 straight silica-glass rods (25) of vertically elongated cross section having flattened side faces (27) and a length of at least 4 inches in fixed regularly spaced positions in a single row (50) with said side faces spaced apart a fixed distance of about 0.005 inch to about 0.03 inch corresponding to the thickness of the silicon crystal wafers (*w*), welding said rods (25) together along at least nine transverse weld lines (15) while they are held in such fixed positions to provide welds (16) bridging the spaces (29) between the rods, said weld lines being regularly spaced and spaced apart a distance which is at least 20 times said fixed distance between the rods, said rods being formed from silica-glass rods of elongated cross section having rough opposed flattened side faces with a width of about 0.3 inch to about 1 inch by heating and drawing said rods to reduce the cross-sectional size while maintaining the same relative cross-sectional shape and to provide the resulting drawn rods (25) with straight smooth flattened side faces (27) having a width of about 0.05 inch to about 0.2 inch.

* * * * *